(12) United States Patent
Kruglick

(10) Patent No.: US 8,962,976 B2
(45) Date of Patent: Feb. 24, 2015

(54) DOPED DIAMOND SOLAR CELL

(75) Inventor: Ezekiel Kruglick, Poway, CA (US)

(73) Assignee: Empire Technology Development LLC, Wilmington, DE (US)

( * ) Notice: Subject to any disclaimer, the term of this patent is extended or adjusted under 35 U.S.C. 154(b) by 1130 days.

(21) Appl. No.: 12/492,015

(22) Filed: Jun. 25, 2009

(65) Prior Publication Data

US 2010/0326509 A1 Dec. 30, 2010

(51) Int. Cl.
| | |
|---|---|
| H01L 31/00 | (2006.01) |
| H01L 31/072 | (2012.01) |
| H01L 31/18 | (2006.01) |
| H01L 31/0392 | (2006.01) |
| H01L 31/0288 | (2006.01) |
| H01L 31/028 | (2006.01) |

(52) U.S. Cl.
CPC ........ H01L 31/03921 (2013.01); H01L 31/072 (2013.01); Y02E 10/547 (2013.01); H01L 31/1804 (2013.01); H01L 31/0288 (2013.01); H01L 31/028 (2013.01)
USPC ........................................................ 136/252

(58) Field of Classification Search
CPC ............................. H01L 31/028; H01L 31/068
USPC ........................................................ 136/252
See application file for complete search history.

(56) References Cited

U.S. PATENT DOCUMENTS

| | | | |
|---|---|---|---|
| 4,571,447 A | | 2/1986 | Prins |
| 5,176,758 A | * | 1/1993 | Nath et al. ................. 136/251 |
| 5,597,762 A | | 1/1997 | Popovici |
| 5,828,117 A | * | 10/1998 | Kondo et al. ............... 257/458 |
| 7,368,658 B1 | * | 5/2008 | Gruen ......................... 136/258 |

OTHER PUBLICATIONS

M. Drake Bell, William J. Leivo, Rectification, Photoconductivity, and Photovoltaic effect in Semiconducting Diamond, American Physical Society, Physical Review 111 No. 5, pp. 1227-1231, Sep. 1, 1958.
Michael D. Whitfield, Simon SM Chan, Richard B. Jackman, Thin Film Diamond Photodiode or Ultraviolet Light Detection, Applied Physics Letters 68, pp. 290-292, Jan. 15, 1996.
G. Popovici, A. Melnikov, V.V. Varichenko, T. Sung, M.A. Prelas, Diamond Ultraviolet Photovoltaic Cell Obtained by Lithium and Boron Doping, Journal of Applied Physics 81 2429, pp. 290-2429-2431, Mar. 1, 1997.
Meiyong Liao, Yasuo Koide, Jose Alvarez, Photovoltaic Schottky Ultraviolet Detectors Fabricated on Boron-Doped Homoepitaxial Diamond Layer, Applied Physics Letters 88 033504, Jan. 18, 2006.
Chemical Vapor Deposition of Diamond, Wikipedia the Free Encyclopedia, http://en.wikipedia.org/wiki/Chemical_vapor_deposition_of_diamond, accessed Jun. 25, 2009.
Optical Coating, Wikipedia the Free Encyclopedia, http://en.wikipedia.org/wiki/Optical_coating, accessed Jun. 25, 2009.
Solar Cell, Wikipedia the Free Encyclopedia, http://en.wikipedia.org/wiki/Solar_cell, accessed on Jun. 25, 2009.
"Toyotas New Solar Panel Option for Prius," http://crave.cnet.co.uk/gadgets/toyota-to-launch-solar-powered-prius-49298037/, published on Jul. 7, 2008, accessed on Feb. 20, 2012, pp. 8.

* cited by examiner

*Primary Examiner* — Jonathan Johnson
*Assistant Examiner* — Allison Bourke

(57) ABSTRACT

Implementations and techniques for doped diamond solar cells are generally disclosed.

19 Claims, 6 Drawing Sheets

DOPED DIAMOND SOLAR CELL

BACKGROUND

Solar cells are photo voltaic cells that may be used to convert solar energy into electrical energy. Such solar cells may contain a p-n junction. Exposure of such a p-n junction to solar energy may result in a potential difference developing across the p-n junction. Such a potential difference may generate a current in a circuit in which the solar cell may be included.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings.

DETAILED DESCRIPTION

Figure 1:
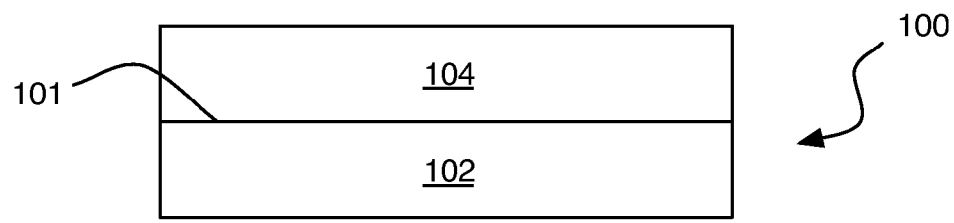
FIG. 1 illustrates a cross-sectional side view a portion of a solar cell at a given stage of processing.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, apparatus, and systems related to doped diamond solar cells.

FIGS. 1-6 illustrate example structures for fabricating doped diamond solar cells. FIGS. 1-6 are provided for purposes of illustration and are not intended to depict structures having exact dimensionalities, shapes etc. nor to depict all components or structures that may be present in some implementations but that have been excluded from FIGS. 1-6 to avoid unnecessarily obscuring claimed subject matter.

FIG. 1 illustrates a cross-sectional side view a portion of a solar cell 100 at a given stage of processing, in accordance with at least some embodiments of the present disclosure. Solar cell 100 may include a substrate 102. Substrate 102 may comprise a transparent material. For example, substrate 100 may include such transparent materials as silica based glass, quartz, non-silica based glass, and/or the like, and/or combinations thereof. Such non-silica based glass may comprise plastics, carbon based glass, metallic glass, and/or the like, for example.

A first transparent conductive layer 104 may be deposited on a surface 101 of substrate 102. For example, transparent conductive layer 104 may be deposited via electron beam evaporation, physical vapor deposition, sputter deposition techniques, and/or the like depending on the materials being deposited. Transparent conductive layer 104 may comprise a material transparent to visible light. Additionally or alternatively, transparent conductive layer 104 may comprise a conductive material. For example transparent conductive layer 104 may include such transparent and/or conductive materials as one or more transparent conductors, one or more metallic antiglare coatings, and/or the like, and/or combinations thereof.

Such transparent conductors may include indium tin oxide (e.g. a combination of indium(III) oxide ($In_2O_3$) and tin(IV) oxide ($SnO_2$)), zinc oxide (ZnO), an/or the like, and/or combinations thereof, for example. In some cases, the transparency of transparent conductive layer 104 may depend on the thickness of a given material. Additionally, in some cases, transparent conductive layer 104 may be transparent to visible light while having poor transmittance in a non-visible portion of the light spectrum. For example, as indium tin oxide may be transparent to visible light while having poor transmittance in the infrared portion of the light spectrum. In operation, transparent conductive layer 104 may be adapted to permit visible light to pass therethrough and may additionally or alternatively be arranged as a contact to transport photogenerated charge carriers away from solar cell 100.

Further, such metallic antiglare coatings may include magnesium fluoride ($MgF_2$), indium tin (e.g. a combination of indium (In) and tin (Sn)) and/or the like, and/or combinations thereof, for example. For example, magnesium fluoride may be utilized as an antiglare layer and may be deposited via physical vapor deposition. Additional or alternative materials may be utilized alone or in combination to form such an antiglare layer. For example, multiple layers may be utilized to broadband antireflection properties. Such to broadband antireflection properties may cover visible light and/or other portions of the spectrum, such as ultraviolet, for example.

Figure 2:
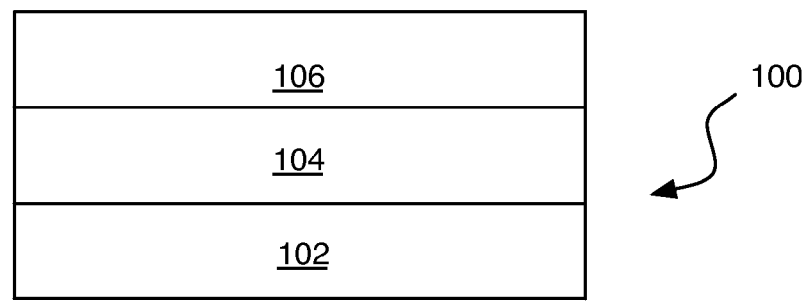
FIG. 2 illustrates a cross-sectional side view a portion of a solar cell at a given stage of processing.

FIG. 2 illustrates a cross-sectional side view a portion of a solar cell 100 at a given stage of processing, in accordance with at least some embodiments of the present disclosure. Solar cell 100 may include a first doped diamond layer 106. Doped diamond layer 106 may be deposited on the first transparent conductive layer 104. For example, doped diamond layer 106 may be deposited via chemical vapor deposition.

Such a chemical vapor deposition may include a microwave plasma enhanced chemical vapor deposition and/or the like.

Doped diamond layer 106 may be a P-type semiconductor. For example, a dopant ion may be incorporated into doped diamond layer 106 during deposition. Such a P-type dopant ion may include ions of Group IIIa of the Periodic Table. Such ions of Group IIIa of the Periodic Table include boron (B), aluminium (Al), gallium (Ga), indium (In), and thallium (TI). In one example, doped diamond layer 106 may be deposited on the first transparent conductive layer 104 and doped with boron ions via chemical vapor deposition with methane ($CH_4$) gas and hydrogen ($H_2$) gas. In such an example, a concentration ratio of $CH_4$ gas to $H_2$ gas may be about 0.08%.

Alternatively, doped diamond layer 106 may be an N-type semiconductor. For example, a dopant ion may be incorporated into doped diamond layer 106 during deposition. Such an N-type dopant ion may include ions of Groups Ia and/or Va of the Periodic Table. Such ions of Groups Ia and/or Va of the Periodic Table include lithium (Li), sodium (Na), potassium (K), rubidium (Rb), caesium (Cs), francium (Fr), nitrogen (N), phosphorus (P), arsenic (As), antimony (Sb), and bismuth (Bi). In one example, doped diamond layer 106 may be deposited on the first transparent conductive layer 104 and doped with lithium ions via chemical vapor deposition with CH4 gas and H2 gas. In such an example, a concentration ratio of CH4 gas to H2 gas may be about 0.08%.

Doped diamond layer 106 may be deposited on the first transparent conductive layer 104 as a thin film. For example, doped diamond layer 106 may be deposited as a thin film with a thickness from about 0.1 microns and to about 10.0 microns. In another example, doped diamond layer 106 may be deposited as a thin film with a thickness from about 0.5 microns and to about 3.0 microns, near about 1.0 micron, or the like. Such thicknesses may influence the capability of doped diamond layer 106 to capture photons and/or may influence the amount and/or significance of imperfections in doped diamond layer 106.

Figure 3:
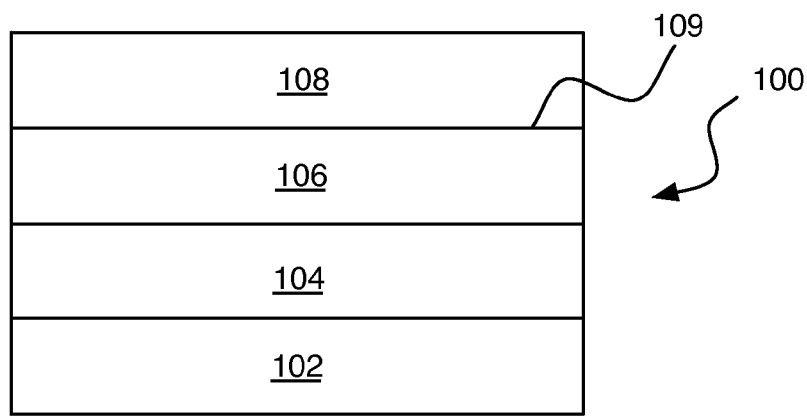
FIG. 3 illustrates a cross-sectional side view a portion of a solar cell at a given stage of processing.

FIG. 3 illustrates a cross-sectional side view a portion of a solar cell 100 at a given stage of processing, in accordance with at least some embodiments of the present disclosure. Solar cell 100 may include a second doped diamond layer 108. Second doped diamond layer 108 may be deposited on the first doped diamond layer 106. Second doped diamond layer 108 may be deposited in a manner similar to the first doped diamond layer 106, as described above.

The first doped diamond layer 106 may be of a first type and the second doped diamond layer 108 may be of a second type, which may form a p-n junction 109. For example, a p-n junction 109 may be formed when the first doped diamond layer 106 is a P-type semiconductor and the second doped diamond layer 108 is an N-type semiconductor. In another example, a p-n junction 109 may be formed when the first doped diamond layer 106 is an N-type semiconductor and the second doped diamond layer 108 is a P-type semiconductor.

P-N junction 109 may be arranged to convert an ultraviolet portion of light into an electrical signal. Additionally or alternatively, p-n junction 109 may be arranged to permit a visible portion of light to pass therethrough. In one example, exposure of p-n junction 109 to light may permit visible portion of light to pass through solar cell 100 while an ultraviolet portion of light may be absorbed, resulting in a potential difference across doped diamond layers 106 and/or 108. Such a potential difference may result in current flow through the p-n junction in solar cell 100.

Figure 7:
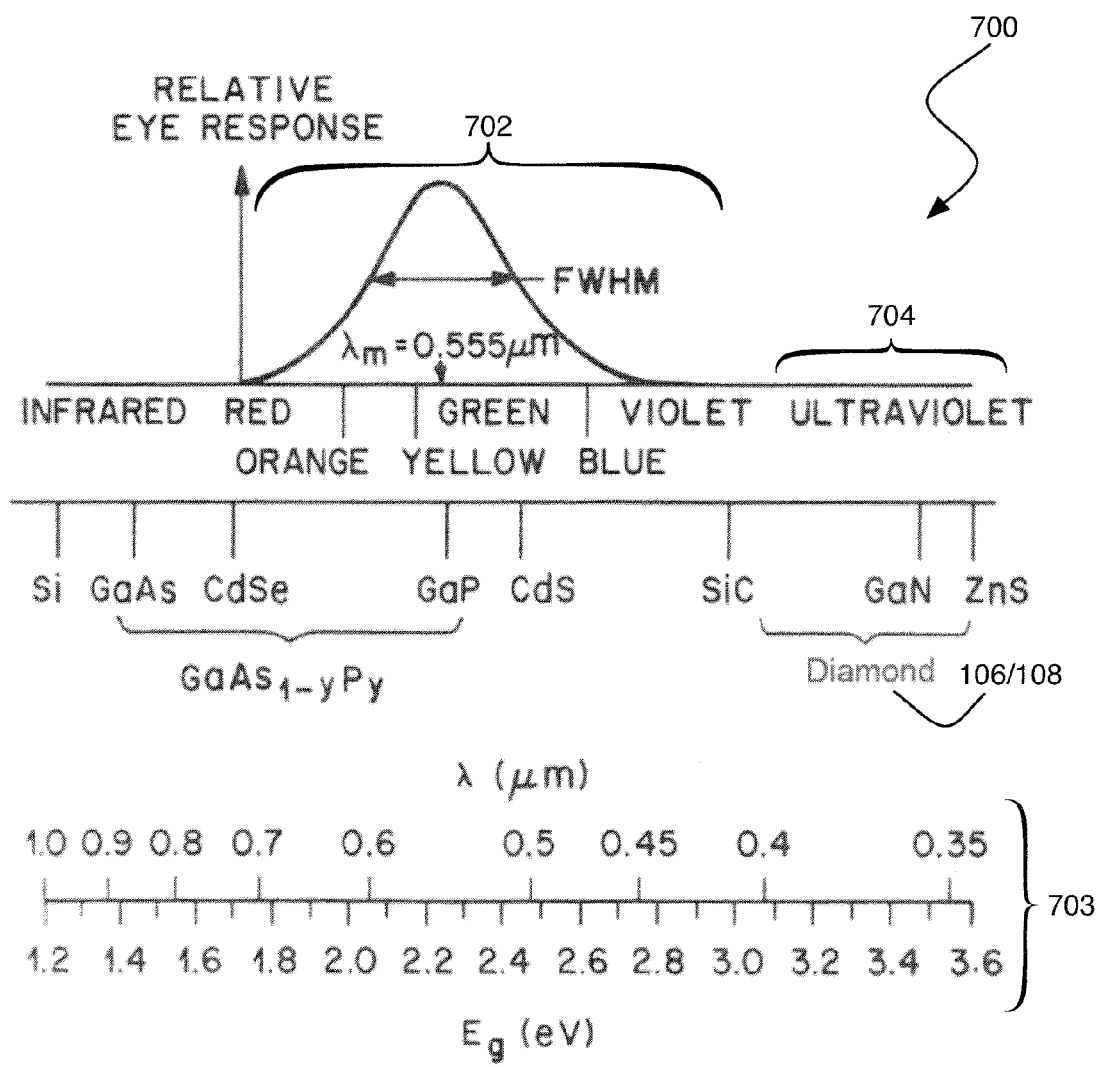
FIG. 7 illustrates a chart of relative eye response to various portions of the light spectrum.

FIG. 7 illustrates a chart 700 of relative eye response to various portions of the light spectrum, in accordance with at least some embodiments of the present disclosure. As illustrated, FIG. 7 illustrates the energy band-gap ($E_g$, in units of eV) for a variety of materials, the visible portion 702 of the light spectrum, and wavelengths 703 of light. The ability of a given material to serve as a photovoltaic device may be dependent on matching the energy band-gap to the energy of the target photon. For example, silicon (Si) may be utilized in the infrared portion of the light spectrum. However, silicon may not present transparent properties in the visible portion 702 of the light spectrum in usable thicknesses. In the ultraviolet portion 704 of the light spectrum photovoltaics such as gallium nitride (GaN) and zinc sulfide (ZnS) may be considered. However, neither gallium nitride nor zinc sulfide may present transparent properties in the visible portion 702 of the light spectrum.

As described in greater detail above, doped diamond layers 106 and/or 108 may be formulated to be transparent to the visible portion 702 of the light spectrum. Additionally, doped diamond layers 106 and/or 108 may be formulated so as to have an energy band-gap configured to absorb ultraviolet portion 704 of the light spectrum. Accordingly, solar cell 100 (FIG. 6) may include doped diamond layers 106 and/or 108 with a strong photovoltaic effect outside the visible portion 702 of the light spectrum as well as a transparency inside the visible portion 702 of the light spectrum.

Figure 4:
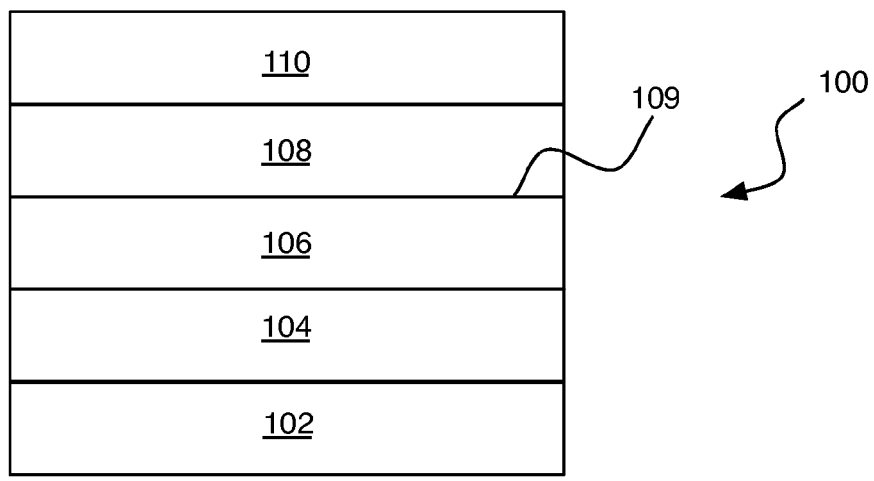
FIG. 4 illustrates a cross-sectional side view a portion of a solar cell at a given stage of processing.

FIG. 4 illustrates a cross-sectional side view a portion of a solar cell 100 at a given stage of processing, in accordance with at least some embodiments of the present disclosure. As illustrated, a second transparent conductive layer 110 may be deposited on second doped diamond layer 108. For example, transparent conductive layer 110 may be deposited via electron beam evaporation, physical vapor deposition, sputter deposition techniques, and/or the like depending on the materials being deposited. Transparent conductive layer 110 may comprise a material transparent to visible light. Additionally or alternatively, transparent conductive layer 110 may comprise a conductive material. For example transparent conductive layer 110 may include such transparent and/or conductive materials as one or more transparent conductors, one or more metallic antiglare coatings, and/or the like, and/or combinations thereof.

Figure 5:
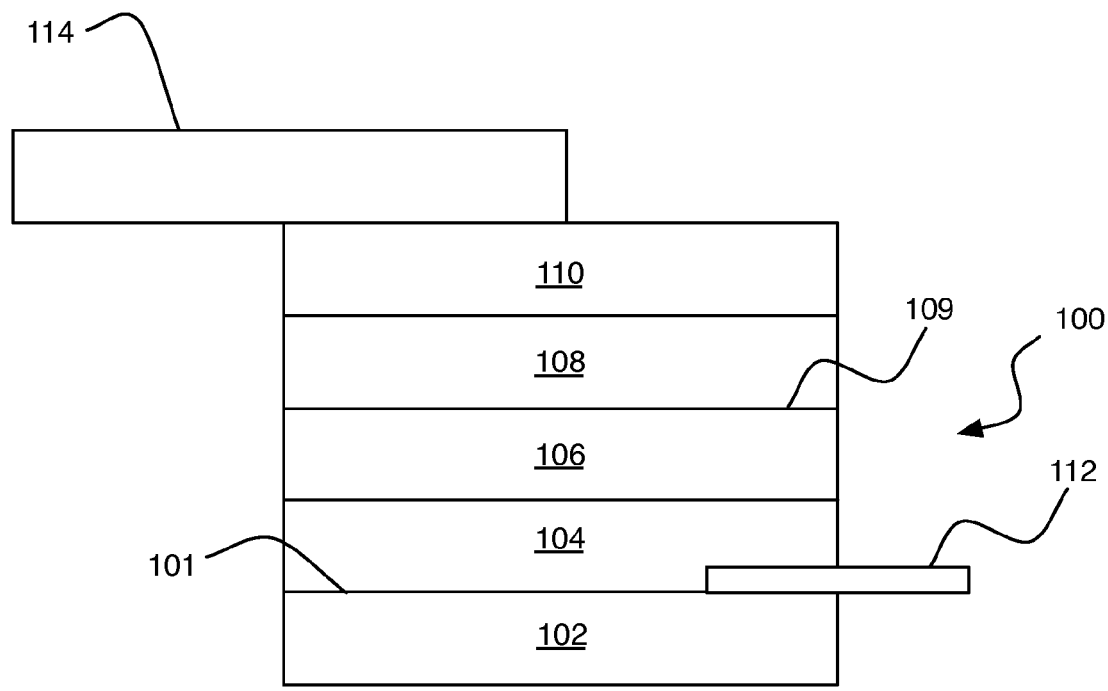
FIG. 5 illustrates a cross-sectional side view a portion of a solar cell at a given stage of processing.

FIG. 5 illustrates a cross-sectional side view a portion of a solar cell 100 at a given stage of processing, in accordance with at least some embodiments of the present disclosure. As illustrated, a first electrode 112 may be operably connected (e.g. coupled) to the first transparent conductive layer 104. In one example, an open space (not shown) may have been left free of first doped diamond layer 106, second doped diamond layer 108, and/or the second transparent conductive layer 110. Such an open space may be configured to receive electrode 112. Additionally or alternatively, a second electrode 114 may be added operably connected to the second transparent conductive layer 110.

First and/or second electrodes 112 and/or 114 may be designed so as to not be visible to the naked eye. For example, first and/or second electrodes 112 and/or 114 may be of a limited size. In such a case, first and/or second electrodes 112 and/or 114 may have a thickness in a range of about 3.0 microns to about 4.0 microns, for example. First and/or second electrodes 112 and/or 114 may be formed from gold (Ag), aluminum (Al), chrome (Cr), titanium (Ti), indium tin oxide, copper (Cu), doped semiconductors and/or other suitable materials. Additionally or alternatively, materials selected for first and/or second electrodes 112 and/or 114 may be selected so as to avoid forming a Schottky type-barrier associated with doped diamond layers 106 and/or 108.

Figure 6:
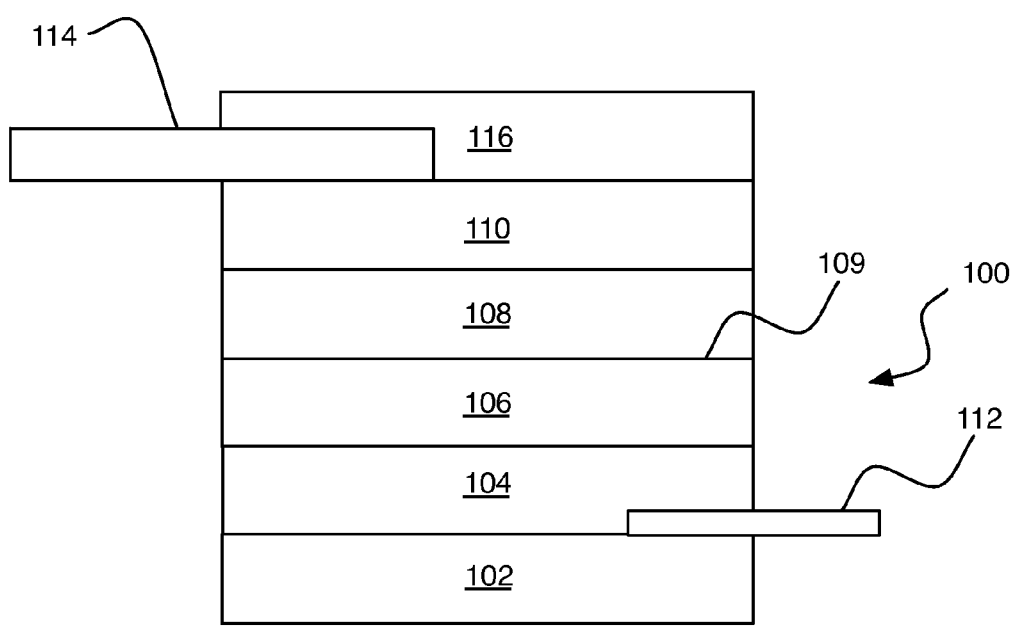
FIG. 6 illustrates a cross-sectional side view a portion of a solar cell at a given stage of processing.

FIG. 6 illustrates a cross-sectional side view a portion of a solar cell 100 at a given stage of processing, in accordance with at least some embodiments of the present disclosure. As illustrated, one or more antiglare and/or tinting layers 116 may be included in solar cell 100. In one example, one or more antiglare and/or tinting layers 116 may be deposited on second transparent conductive layer 110. Additionally or alternatively, one or more antiglare and/or tinting layers 116 may be deposited on transparent substrate 102.

Such antiglare layers may include magnesium fluoride (MgF2), indium tin (e.g. a combination of indium (In) and tin (Sn)), and/or the like, and/or combinations thereof, for example. For example, magnesium fluoride ($MgF_2$) may be utilized as an antiglare layer and may be deposited via physical vapor deposition. Additional or alternative materials may be utilized alone or in combination to form such an antiglare layer. For example, multiple layers may be utilized to broadband antireflection properties. Such to broadband antireflection properties may cover visible light and/or other portions of the spectrum, such as ultraviolet, for example.

Such tinting layers may be arranged to restrict certain wavelengths of the light spectrum from passing therethrough. Such tinting layers may include dye, metallization, and/or the like, and/or combinations thereof. In one example, one or more tinting layers may be positioned between a light source and first and second doped diamond layers 106/108. In such a case, such tinting layers may be arranged to restrict an infrared portion, a visible portion, and/or the like, of the light spectrum from passing therethrough. Additionally or alternatively, one or more tinting layers may be positioned so that first and second doped diamond layers 106/108 may be positioned between a light source and the one or more tinting layers. In such a case, such tinting layers may be arranged to restrict an ultraviolet portion, an infrared portion, a visible portion, and/or the like, of the light spectrum from passing therethrough.

Figure 8:
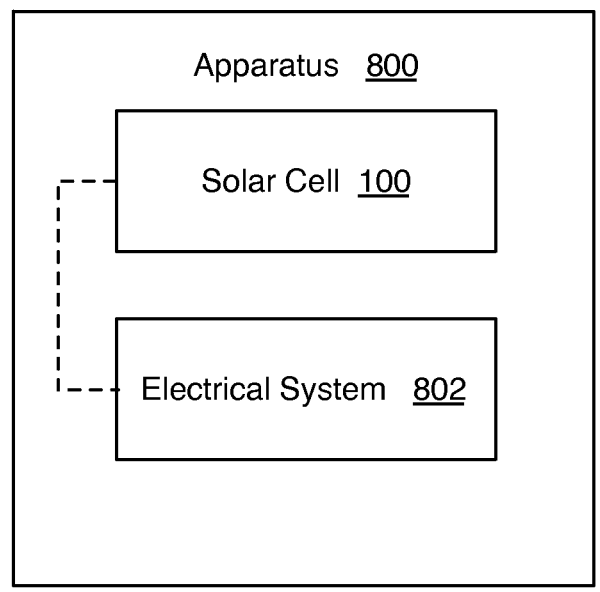
FIG. 8 illustrates an apparatus including a solar cell.

FIG. 8 illustrates an apparatus 800 including a solar cell 100, in accordance with at least some embodiments of the present disclosure. As illustrated, apparatus 800 may include an electrical system 802 operably connected (e.g., coupled) to solar cell 100. Solar cell 100 may be arranged to convert light into electrical signals for use by electrical system 802. In some examples, solar cell 100 may be oriented and arranged as a windshield (such as for vehicles, for example), a window (such as for buildings, for example), a lens (such as an eyewear lens, for example), a container (such as a beverage container, for example), and/or the like, and/or combinations thereof. In some examples, apparatus 800 may include at least a portion of a vehicle, a building, eyewear, a container, and/or the like, and/or combinations thereof.

In one example, apparatus 800 may include a vehicle having one or more windshields and/or windows that include solar cell 100. In such an example, such a vehicle may also include an electrical system 802 powered at least in part by solar cell 100. For example, such a vehicle may include electronics, an electrical motor, lighting, a heating system, a cooling system, and/or the like, and/or combinations thereof (not shown) powered at least in part by solar cell 100.

In a further example, apparatus 800 may include a building having one or more windows that include solar cell 100. In such an example, such a building may also include an electrical system 802 powered at least in part by solar cell 100. For example, such a building may include electronics, lighting, a heating system, a cooling system, and/or the like, and/or combinations thereof (not shown) powered at least in part by solar cell 100.

In a still further example, apparatus 800 may include a piece of eyewear having a lens that includes solar cell 100. In such an example, such eyewear may also include an electrical system 802 powered at least in part by solar cell 100. For example, such eyewear may include a display and/or audio input/output system (not shown) powered at least in part by solar cell 100.

In another example, apparatus 800 may include a beverage container having at least a portion thereof that includes solar cell 100. In such an example, such a beverage container may also include an electrical system 802 powered at least in part by solar cell 100. For example, such a beverage container may include a cooling system (not shown), such as a thermoelectric-type cooling system, powered at least in part by solar cell 100.

Referring back to FIG. 6, as illustrated, solar cell 100 may include first transparent conductive layer 104 that may be coupled to surface 101 of transparent substrate 102. First doped diamond layer 106 of a first type may be coupled to the first transparent conductive layer 104. Second doped diamond layer 108 of a second type may be coupled to the first doped diamond layer 106. The first and second doped diamond layers 106/108 may form a p-n junction 109 arranged to convert light into electricity. Second transparent conductive layer 110 may be coupled to the second doped diamond layer 108. First electrode 112 may be operably connected (e.g., coupled) to the first transparent conductive layer 104 while second electrode 114 may be operably connected (e.g., coupled) to the second transparent conductive layer 110.

Figure 9:
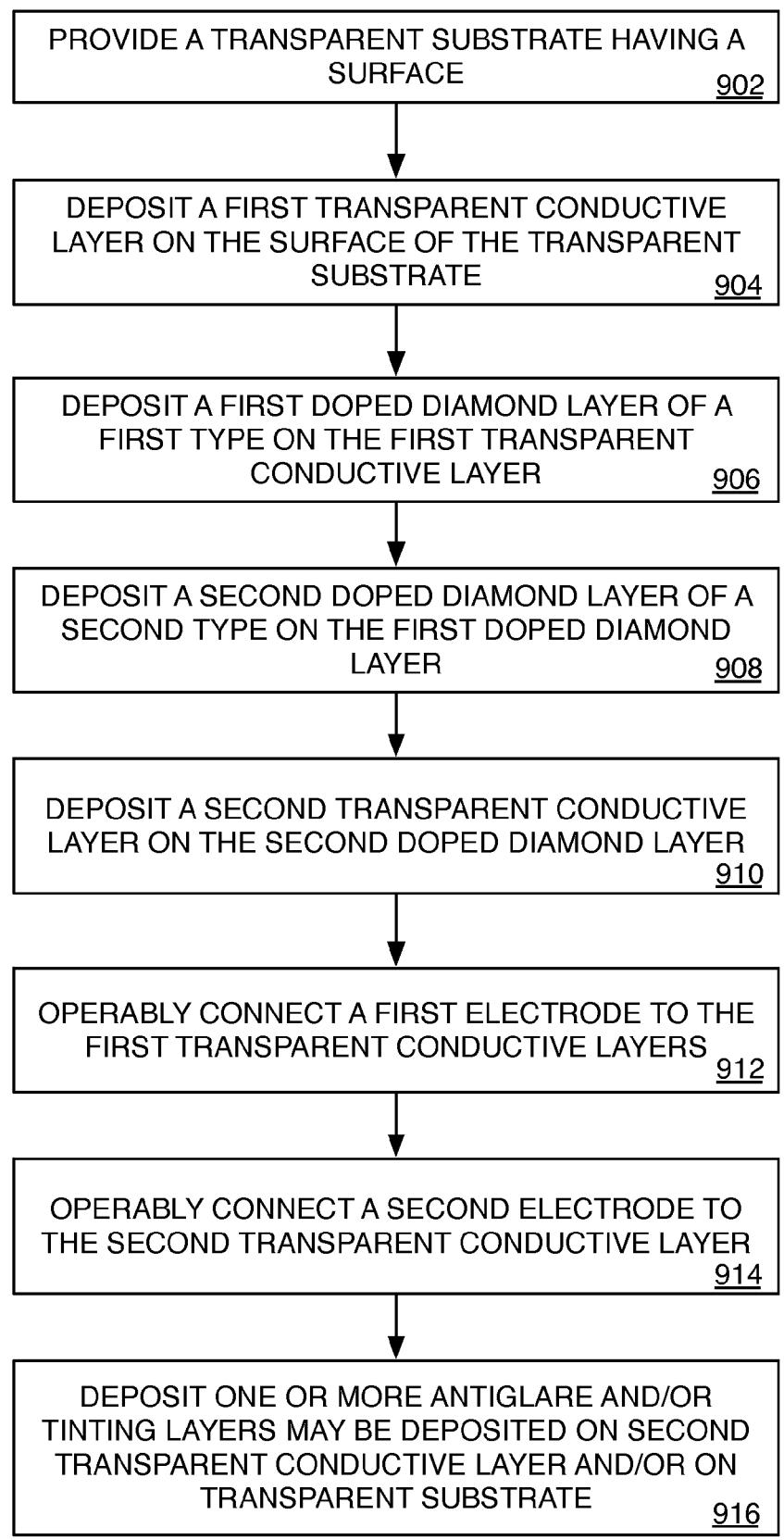
FIG. 9 illustrates an example process for generating doped diamond solar cells, all arranged in accordance with at least some embodiments of the present disclosure.

FIG. 9 illustrates an example process 900 for generating doped diamond solar cells in accordance with at least some embodiments of the present disclosure. Process 900, and other processes described herein, set forth various functional blocks or actions that may be described as processing steps, functional operations, events and/or acts, etc. Those skilled in the art in light of the present disclosure will recognize that numerous alternatives to the functional blocks shown in FIG. 9 may be practiced in various implementations. For example, although process 900, as shown in FIG. 9, comprises one particular order of blocks or actions, the order in which these blocks or actions are presented does not necessarily limit claimed subject matter to any particular order. Likewise, intervening actions not shown in FIG. 9 and/or additional actions not shown in FIG. 9 may be employed and/or some of the actions shown in FIG. 9 may be eliminated, without departing from the scope of claimed subject matter. An example process may include one or more of blocks 902, 904, 906, 908, 910, 912, 914 and/or 916.

At block 902, a transparent substrate may be provided. At block 904, a first transparent conductive layer 104 may be deposited on a surface 101 of substrate 102. At block 906, a first doped diamond layer may be deposited on the first transparent conductive layer. At block 908, a second doped diamond layer may be deposited on the first doped diamond layer. The first doped diamond layer of a first type and second doped diamond layer of a second type, which may together form a p-n junction. Such a p-n junction may be arranged to convert an ultraviolet portion of light into an electrical signal (e.g., voltage, current, charge, etc.). For example, exposure of such a p-n junction to light may permit visible portion of light to pass through such a solar cell while an ultraviolet portion of light may be absorbed, which may result in a potential difference across the first and second doped diamond layers.

At block 910, a second transparent conductive layer may be deposited on second doped diamond layer. At block 912, a first electrode may be operably connected (e.g., coupled) to the first transparent conductive layer. At block 914, a second electrode may be operably connected (e.g., coupled) to the second transparent conductive layer. At block 916, one or more antiglare and/or tinting layers may be deposited on second transparent conductive layer and/or on transparent substrate. As discussed in greater detail above, all or portions of such a solar cell may be arranged to permit a visible portion of light to pass therethrough.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A method to produce a solar cell configured to produce an electrical signal in response to incident light, comprising:
   providing a transparent substrate having a surface;
   depositing a first transparent conductive layer on the surface of the transparent substrate;
   depositing a first doped diamond layer of a first type on the first transparent conductive layer;
   depositing a second doped diamond layer of a second type on the first doped diamond layer, wherein the first and second doped diamond layer form a p-n junction, wherein the p-n junction is responsive to at least a portion of the incident light such that the p-n junction converts the incident light into the electrical signal; and
   depositing a second transparent conductive layer on the second doped diamond layer, wherein:
   the p-n junction is adapted to convert an ultraviolet portion of the incident light into the electrical signal while permitting a visible portion of light to pass therethrough, the p-n junction having a band-gap configured to absorb ultraviolet incident light while the band-gap is not responsive to visible light, such that the p-n junction is configured to not convert the visible portion of incident light into the electrical signal; and one or more of the first doped diamond layer and the second doped diamond layer has a thickness in a range from about 0.1 microns to about 10.0 microns.

2. The method of claim 1, further comprising:
operably connecting a first electrode to the first transparent conductive layer; and
operably connecting a second electrode to the second transparent conductive layer.

3. The method of claim 1, wherein either the first or second transparent conductive layers comprises one or more of indium tin oxide and/or one or more metallic antiglare coatings.

4. The method of claim 1, wherein either depositing of the first doped diamond layer or depositing of the second doped diamond layer comprises depositing a diamond layer doped with ions of Groups Ia and/or Va of the Periodic Table via chemical vapor deposition with methane gas and hydrogen gas.

5. The method of claim 1, wherein either depositing of the first doped diamond layer or depositing of the second doped diamond layer comprises depositing a diamond layer doped with ions of Groups Ia and/or Va of the Periodic Table via chemical vapor deposition with methane gas and hydrogen gas, wherein a concentration ratio of methane gas to hydrogen gas is about 0.08%.

6. The method of claim 1, wherein either depositing of the first doped diamond layer or depositing of the second doped diamond layer comprises depositing a diamond layer doped with ions of Group IIIa of the Periodic Table via chemical vapor deposition with methane gas and hydrogen gas.

7. The method of claim 1, further comprising:
operably connecting a first electrode to the first transparent conductive layer;
operably connecting a second electrode to the second transparent conductive layer;
wherein either the first or second transparent conductive layers comprises one or more of indium tin oxide and/or one or more metallic antiglare coatings;
wherein depositing of either the first doped diamond layer or the second doped diamond layer comprises depositing a diamond layer comprising a thickness in a range from about 0.5 microns to about 3.0 microns doped with lithium ions via chemical vapor deposition with methane gas and hydrogen gas, wherein a concentration ratio of methane gas to hydrogen gas is about 0.08%;
wherein depositing of either the first doped diamond layer or the second doped diamond layer comprises depositing a diamond layer comprising a thickness in a range from about 0.5 microns to about 3.0 microns doped with boron ions via chemical vapor deposition with methane gas and hydrogen gas, wherein a concentration ratio of methane gas to hydrogen gas is about 0.08%.

8. A solar cell that is arranged to generate an electrical signal in response to incident light, the solar cell comprising:
a transparent substrate having a surface;
a first transparent conductive layer coupled to the surface;
a first doped diamond layer of a first type coupled to the first transparent conductive layer;
a second doped diamond layer of a second type coupled to the first doped diamond layer, wherein:
the first doped diamond layer and the second doped diamond layer form a p-n junction that is arranged to generate the electrical signal responsive to at least a portion of the incident light;
the p-n junction is adapted to convert an ultraviolet portion of the incident light into the electrical signal while permitting a visible portion of light to pass therethrough, the p-n junction having a band-gap configured to absorb ultraviolet incident light while the band-gap is not responsive to visible light, such that the p-n junction is configured to not convert the visible portion of incident light into the electrical signal; and
one or more of the first doped diamond layer and/or the second doped diamond layer has a thickness in a range from about 0.1 microns to about 10.0 microns; and
a second transparent conductive layer coupled to the second doped diamond layer.

9. The solar cell of claim 8, further comprising:
a first electrode operably connected to the first transparent conductive layer; and
a second electrode operably connected to the second transparent conductive layer.

10. The solar cell of claim 8, wherein the solar cell comprises one of a windshield, a window, a lens, or combinations thereof.

11. The solar cell of claim 8,
wherein either the first or second transparent conductive layers comprises one or more of indium tin oxide and/or one or more metallic antiglare coatings; and
wherein of either the first doped diamond layer or the second doped diamond layers are doped with boron ions via chemical vapor deposition.

12. An apparatus that is arranged to generate an electrical signal in response to incident light, the apparatus comprising:
a solar cell, comprising:
a transparent substrate having a surface;
a first transparent conductive layer coupled to the surface;
a first doped diamond layer of a first type coupled to the first transparent conductive layer;
a second doped diamond layer of a second type coupled to the first doped diamond layer, wherein:
the first doped diamond layer and the second doped diamond layer form a p-n junction that is arranged to generate the electrical signal responsive to at least a portion of the incident light;
the p-n junction is adapted to convert an ultraviolet portion of the incident light into the electrical signal while permitting a visible portion of light to pass therethrough, the p-n junction having a band-gap configured to absorb ultraviolet incident light while the band-gap is not responsive to visible light, such that the p-n junction is configured to not convert the visible portion of incident light into the electrical signal; and
one or more of the first doped diamond layer and/or the second doped diamond layer has a thickness in a range from about 0.1 microns to about 10.0 microns; and
a second transparent conductive layer coupled to the second doped diamond layer; and
an electrical system operably connected to the solar cell and arranged to receive the electrical signal.

13. The apparatus of claim 12, wherein the apparatus comprises one of a vehicle, an eyewear, a building, a container, or combinations thereof.

14. The apparatus of claim 12, wherein the solar cell comprises one of a windshield, a window, a lens, or combinations thereof.

15. The apparatus of claim 12, further comprising:
a first electrode operably connected to the first transparent conductive layer and operably connected to the electrical system; and
a second electrode operably connected to the second transparent conductive layer and operably connected to the electrical system.

16. The solar cell of claim 8,
wherein one of the first type or second type of doped diamond layer is an N-type semiconductor including one or more dopant ions dopant ions selected from Group Ia of the Periodic Table, including lithium (Li), sodium (Na), potassium (K), rubidium (Rb), caesium (Cs), or francium (Fr).

17. The apparatus of claim 12,
wherein one of the first type or second type of doped diamond layer is an N-type semiconductor including one or more dopant ions selected from Group Ia of the Periodic Table, including lithium (Li), sodium (Na), potassium (K), rubidium (Rb), caesium (Cs), or francium (Fr).

18. The solar cell of claim 8, wherein the solar cell is transparent to visible light.

19. The apparatus of claim 12, wherein the solar cell is transparent to visible light.

\* \* \* \* \*

UNITED STATES PATENT AND TRADEMARK OFFICE
CERTIFICATE OF CORRECTION

| | | |
|---|---|---|
| PATENT NO. | : 8,962,976 B2 | Page 1 of 1 |
| APPLICATION NO. | : 12/492015 | |
| DATED | : February 24, 2015 | |
| INVENTOR(S) | : Kruglick | |

It is certified that error appears in the above-identified patent and that said Letters Patent is hereby corrected as shown below:

In the Specification

In Column 2, Line 17, delete "substrate 100" and insert -- substrate 102 --, therefor.

In Column 2, Line 37, delete "an/or the" and insert -- and/or the --, therefor.

In the Claims

In Column 9, Line 29, in Claim 6, delete "IIIa" and insert -- IIIa --, therefor.

In Column 11, Line 11, in Claim 16, delete "dopant ions dopant ions" and insert -- dopant ions --, therefor.

Signed and Sealed this
First Day of September, 2015

Michelle K. Lee
*Director of the United States Patent and Trademark Office*